United States Patent [19]

Nakamura

[11] 4,255,793

[45] Mar. 10, 1981

[54] APPARATUS FOR GENERATING NONLINEAR PULSE PATTERNS

[75] Inventor: Michiyuki Nakamura, Pleasant Hill, Calif.

[73] Assignee: The United States of America as represented by the United States Department of Energy, Washington, D.C.

[21] Appl. No.: 47,449

[22] Filed: Jun. 11, 1979

[51] Int. Cl.³ .................... G06F 15/31; H03K 3/78
[52] U.S. Cl. ................... 364/701; 309/271; 328/48; 328/63; 328/145; 364/722
[58] Field of Search ........ 364/569, 701, 722; 307/269, 271; 328/41, 48, 63, 140, 142, 145

[56] References Cited

U.S. PATENT DOCUMENTS

| | | | |
|---|---|---|---|
| 3,566,095 | 2/1971 | Scmitz | 328/63 X |
| 3,621,403 | 11/1971 | Seiy | 328/61 |
| 3,673,391 | 6/1972 | Lougheed | 364/701 |
| 3,870,963 | 3/1975 | Groce et al. | 328/63 X |
| 3,944,858 | 3/1976 | Pettersson | 307/269 |
| 3,952,253 | 4/1976 | DeVolpi et al. | 328/63 |
| 3,962,572 | 6/1976 | Stolzy | 328/48 X |
| 4,049,953 | 9/1977 | Evans, Jr. | 307/271 X |
| 4,056,778 | 11/1977 | Randazzo | 324/166 |
| 4,086,471 | 4/1978 | Takahashi | 235/92 DM |
| 4,089,060 | 5/1978 | Mitchell | 364/722 |

OTHER PUBLICATIONS

E. F. Denby et al., "Simple Logarithmic Time Base Generator", *Rev. Sci. Instrum.*, Feb., 1978, pp. 267-268.
J. M. Rochelle et al., "Miniaturized Logarithmic Count-Rate Circuit", *Rev. Sci. Instrum.*, vol. 44, No. 11, Nov., 1973, pp. 1638-1643.
W. N. Trump et al., "A Logarithm Time Base Generator or Counter", *Rev. Sci. Instrum.*, vol. 45, No. 5, May, 1974, pp. 714-716.
L. J. Wills et al., "Logarithmic Time Base Generator", *Rev. Sci. Instrum.*, vol. 46, No. 8, Aug., 1975, pp. 1030-1031.

*Primary Examiner*—Jerry Smith
*Attorney, Agent, or Firm*—James E. Denny; Roger S. Gaither; Clifton E. Clouse, Jr.

[57] ABSTRACT

Apparatus for generating a plurality of nonlinear pulse patterns from a single linear pulse pattern. A first counter counts the pulses of the linear pulse pattern and a second counter counts the pulses of the nonlinear pulse pattern. A comparator compares the counts of both counters, and in response to an equal count, a gate is enabled to gate a pulse of the linear pattern as a pulse of the nonlinear pattern, the latter also resetting the first counter. Presettable dividers divide the pulses of each pattern before they are counted by the respective counters.

Also, apparatus for generating a logarithmic pulse pattern from a linear pulse pattern to any log base. In one embodiment, a shift register is used in place of the second counter to be clocked by each pulse of the logarithmic pattern to generate the pattern. In another embodiment, a memory stores the logarithmic pattern and is addressed by the second counter which is clocked by the pulses of the logarithmic pulse pattern.

19 Claims, 9 Drawing Figures

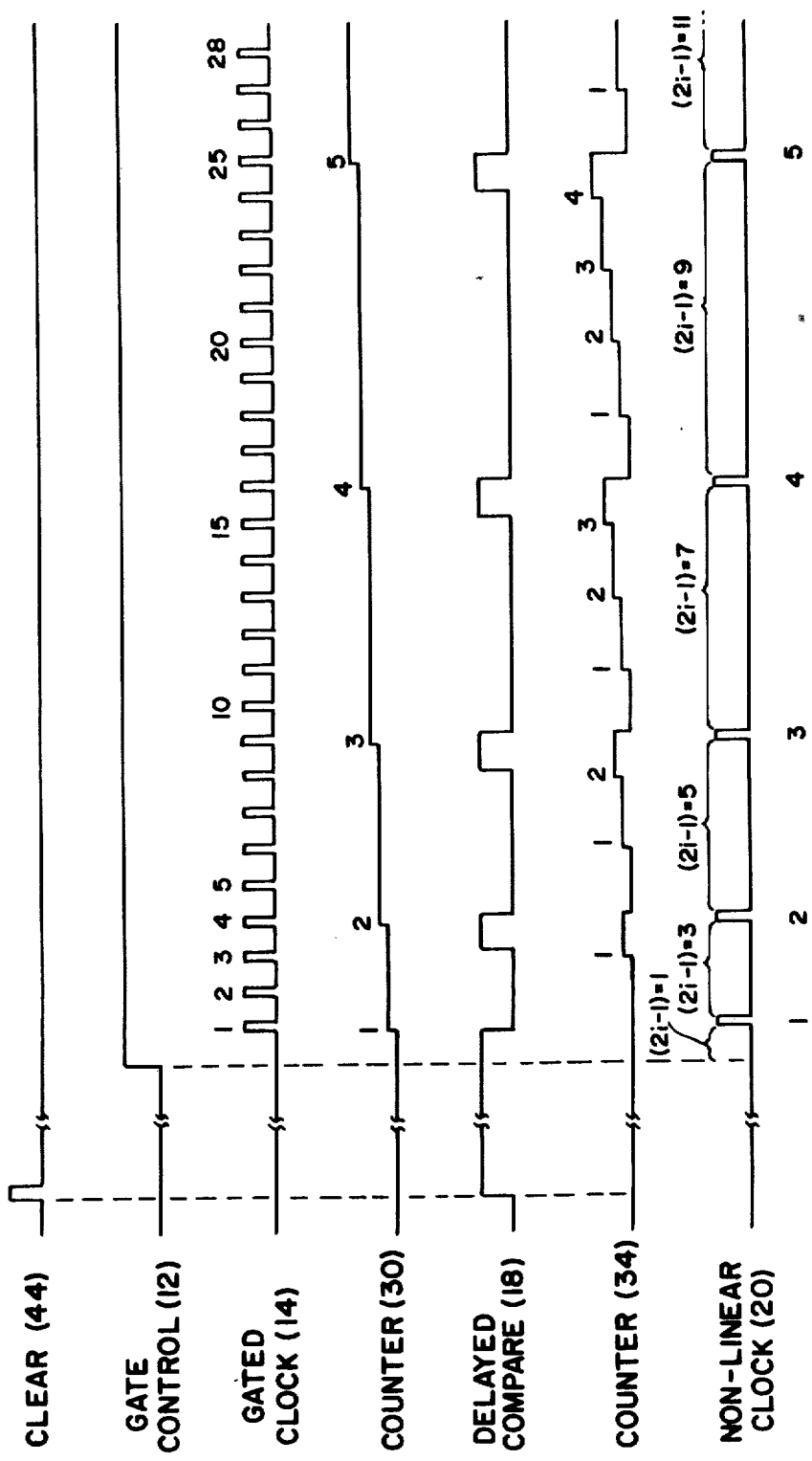
FIG_4

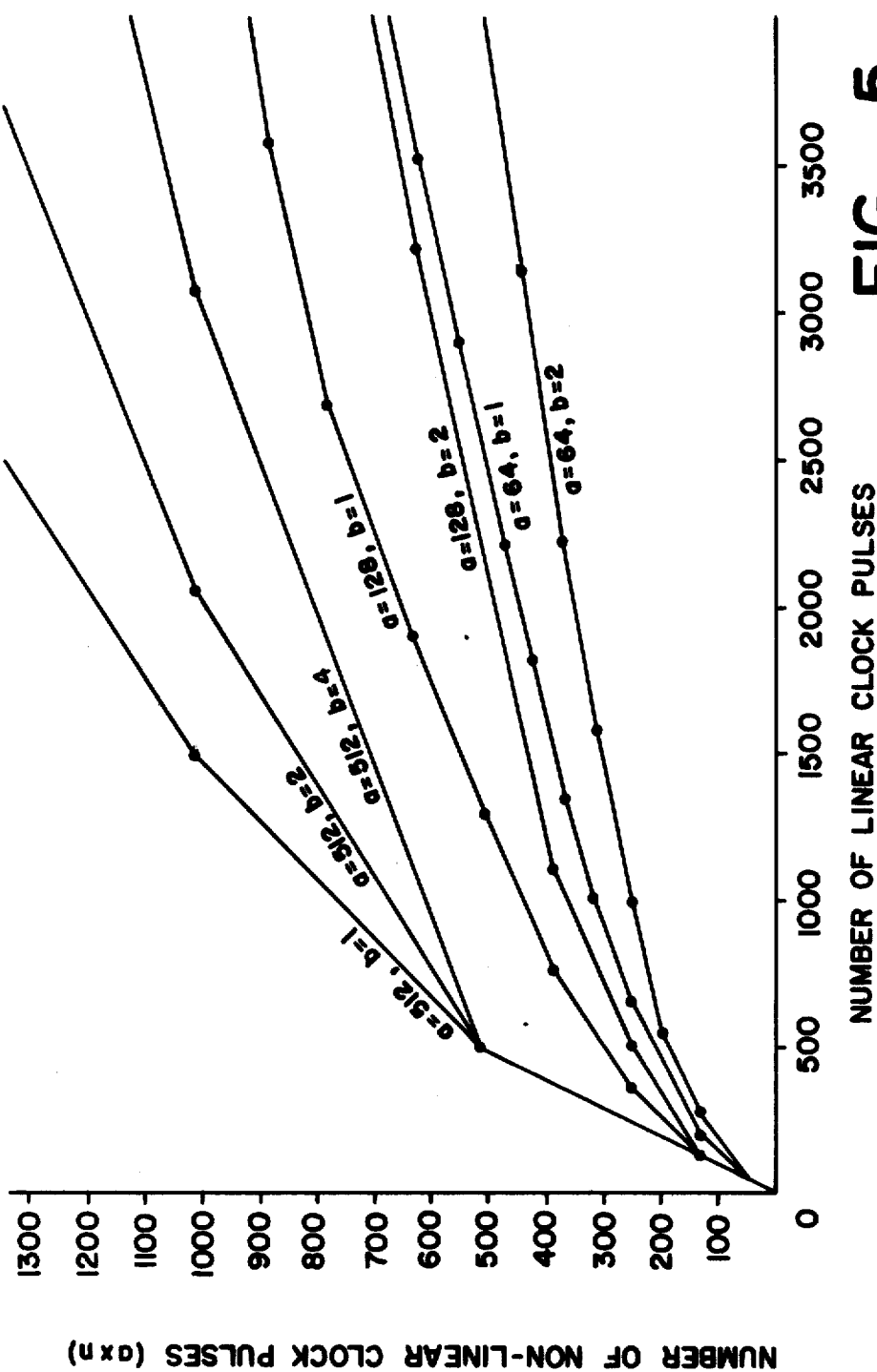
FIG_5

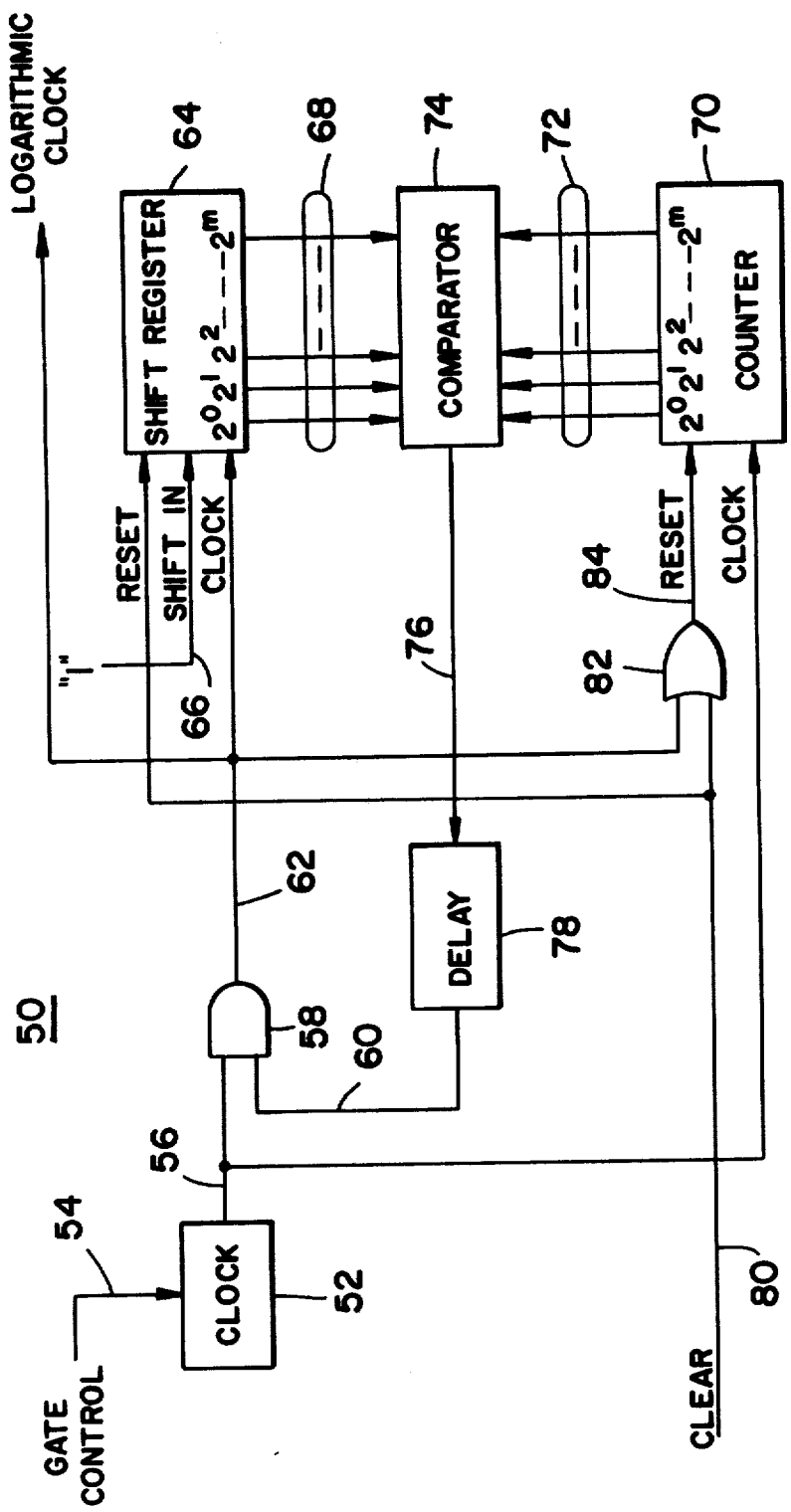
FIG_6

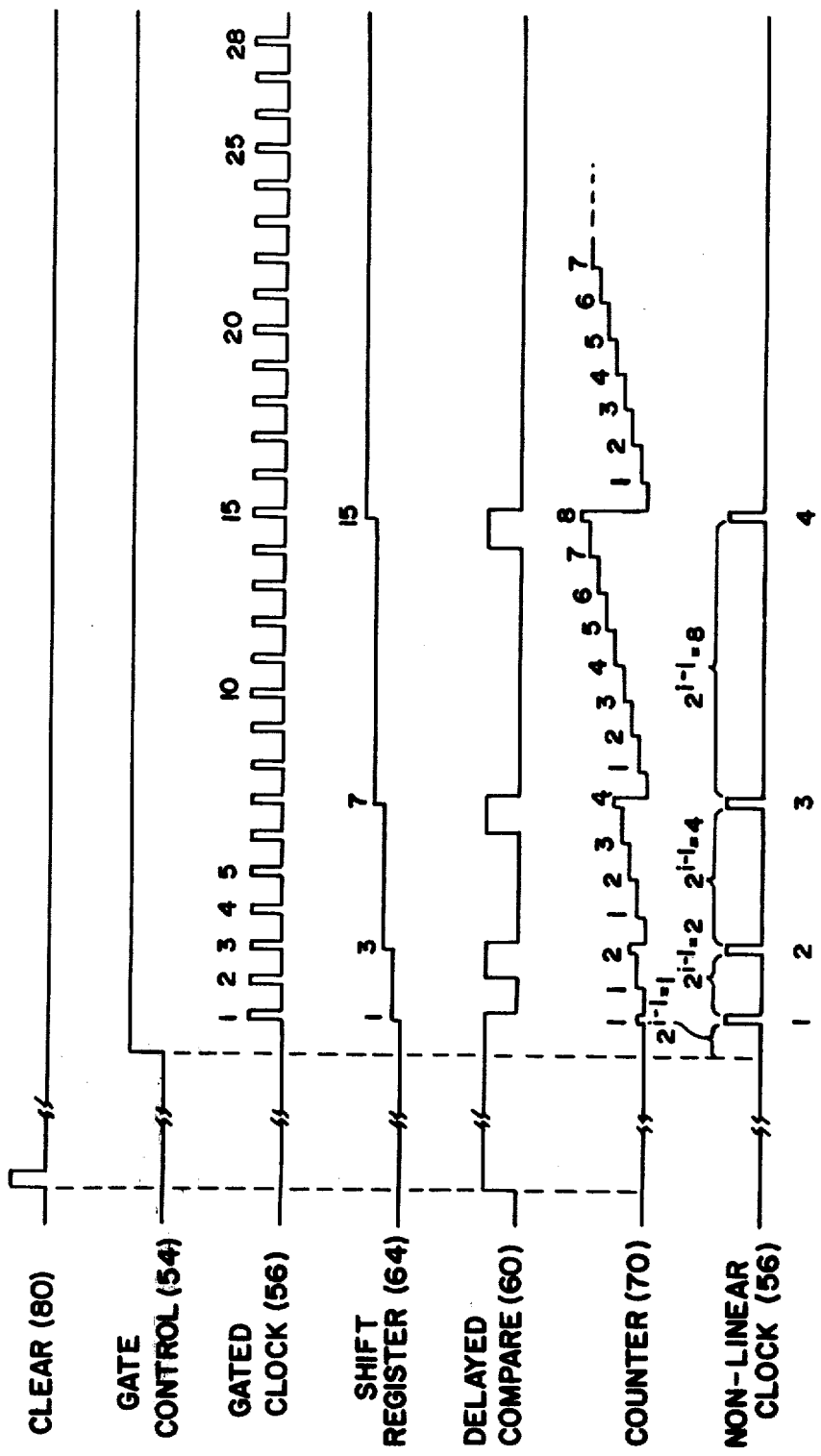

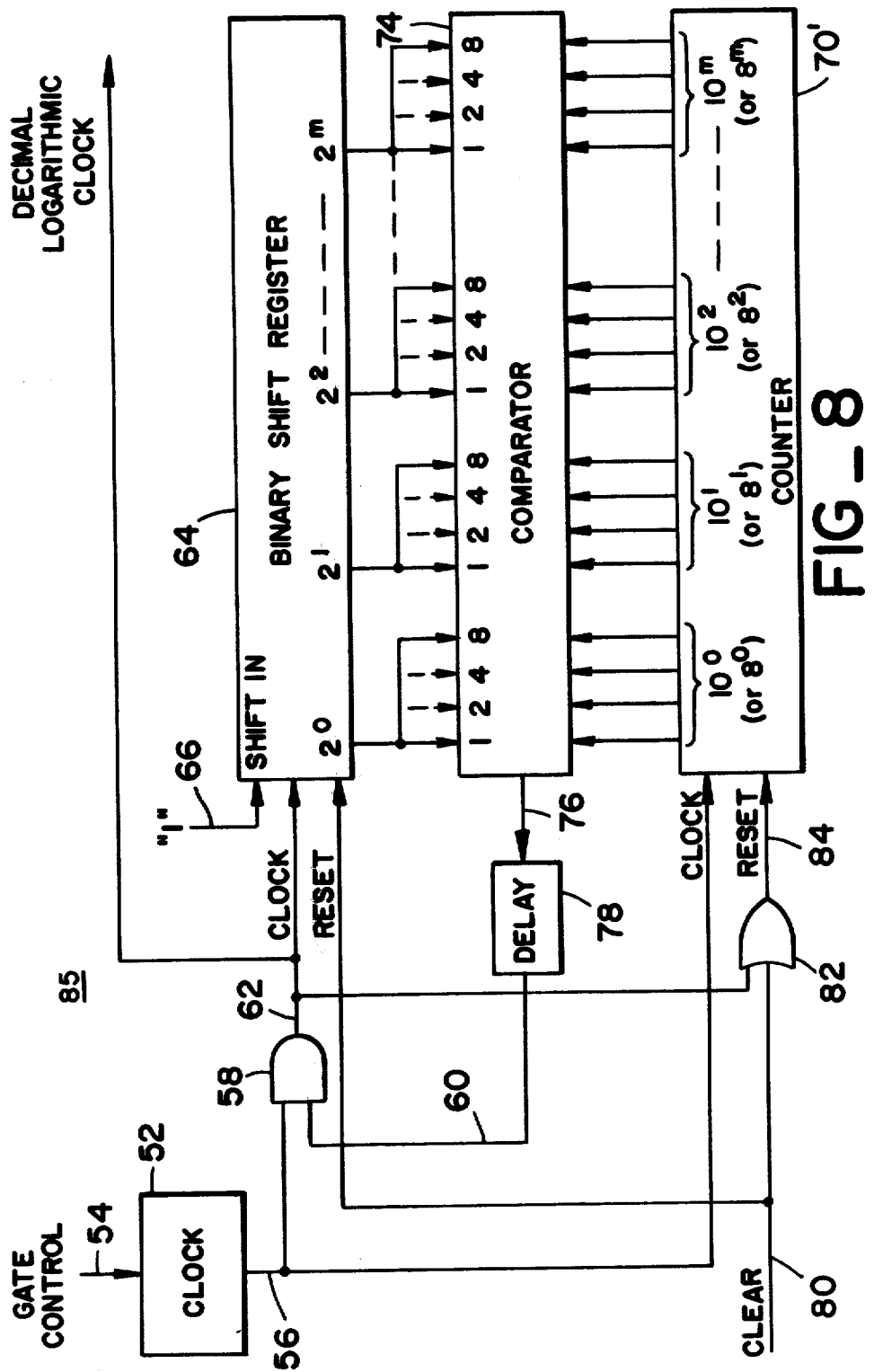
FIG_8

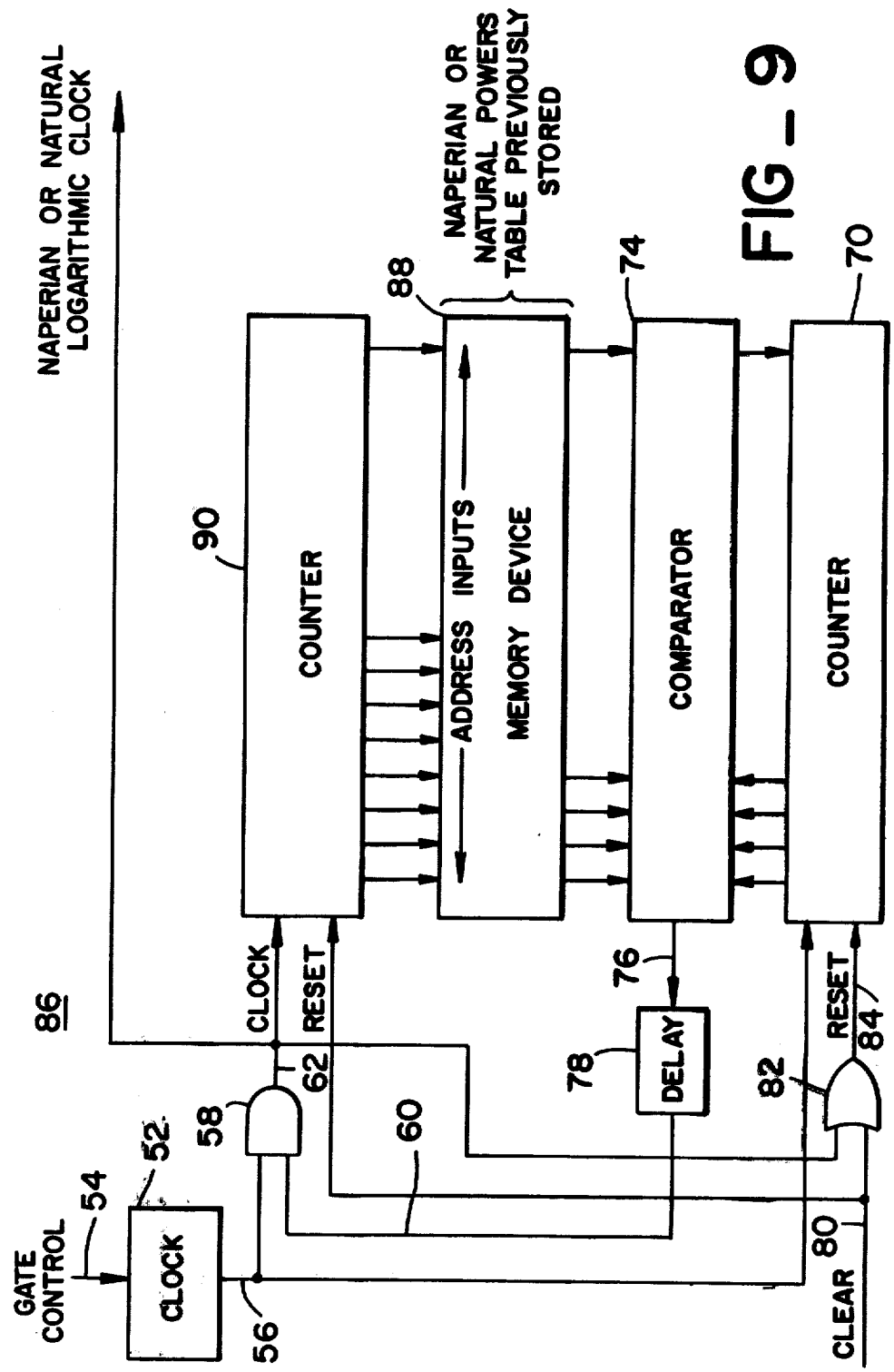

APPARATUS FOR GENERATING NONLINEAR PULSE PATTERNS

The invention described herein arose under, or in the course of, Contract No. W-4705-ENG-48 between the United States Department of Energy and the University of California.

BACKGROUND OF THE INVENTION

The invention relates to apparatus for converting one pulse pattern into another pulse pattern and, more particularly, to apparatus for generating nonlinear pulse patterns from a linear pulse pattern.

In the performance of experiments, for example, an event will occur that should be detected and measured. For example, two characteristics that might or should be measured are the time and energy of the event. Typically, the event is measured by charging a capacitor to a voltage proportional to the time or energy of the event and then linearly discharging the capacitor to a predetermined level. Pulses are then generated during the discharging of the capacitor and are counted by a counter with a number of pulses counted being directly proportional to the capacitor voltage and the count stored in memory. Consequently, this count provides information, concerning the time or energy of the event.

There are occasions when, for example, the counter capacity and memory are too small for the time or energy range of interest of the event. Larger capacity counters and memory can be used to accommodate the large range, but this is costly.

Nonlinear pulse pattern generators have been developed which increase the range of measurement of the event without employing the larger capacity counters and memory. For example, U.S. Pat. No. 3,566,095 discloses a digital system in which a nonlinear pulse pattern is generated from a linear pulse pattern. This system counts the pulses of the linear pattern, in which the count is proportional to the characteristic of the event being measured, and generates output pulses of a nonlinear pattern so that there are proportionally fewer output pulses as the range of the event being measured gets larger. Specifically, this system generates output pulses at intervals of occurrence proportional to the square root of the number of pulses of the linear pattern that have been counted between the zero axis crossings of a signal.

A disadvantage with the generator of the above-mentioned U.S. patent is that it can generate only one nonlinear pulse pattern from the linear pulse pattern. As just mentioned, the specific nonlinear pulse pattern that can be produced by this generator is proportional to the square root of the number of pulses of the linear pattern which are counted between the zero axis crossings of a signal. Consequently, this generator is not flexible in that it may not be suitable for measuring characteristics of different events having different ranges of interest.

Also, other nonlinear pulse pattern generators are known which are specifically designed to generate a logarithmic pulse pattern from an input linear pulse pattern. A logarithmic pulse pattern has wide applicability in view of the fact that, for example, many naturally occurring events whose characteristics are to be measured have a logarithmic function. Two examples of logarithmic pulse pattern generators are disclosed in U.S. Pat. No. 4,089,060 and a publication entitled "A Logarithmic Time Based Generator or Counter," by Trump, et al, Rev. Sci. Instrum., Vol. 45, No. 5, May, 1974.

While the above and other logarithmic pulse pattern generators produce logarithmic patterns, they have the disadvantage of reducing what are known as truncating errors by waiting a fixed period after the start of the pulses of the linear clock pulse pattern before generating the logarithmic pulse pattern. That is, these prior logarithmic pulse pattern generators utilize counters which, initially, are caused to count to a preset count before the logarithmic pulse pattern begins to be produced. This preset count constitutes an undesirable delay that is introduced in these generators. The above-mentioned publication, for example, states that truncation errors may be minimized by making this delay as large as possible.

Furthermore, the above logarithmic pulse generators have the disadvantage of producing logarithmic patterns to only a limited number of log bases. For example, the generator of the above publication can produce logarithmic patterns which are to the log base $a/(a-1)$. This means that the practical limits of this system can produce logarithmic patterns only from log base 1 to log base 2 for very large values of "a" down to $a=2$, respectively. A value of "a" less than 2 is impractical in this system because the next lower number would be $a=1$ and the value for $a/(a-1)$ would be infinity.

It is an object of the present invention to provide a novel nonlinear pulse pattern generator and a novel logarithmic pulse pattern generator.

It is another object of the present invention to produce digital nonlinear and logarithmic pulse pattern generators which can be used to measure different events over large ranges of interest for a system of limited data capacity.

A further specific object of the present invention is to produce a nonlinear pulse pattern generator which can generate different nonlinear pulse patterns from a single linear pulse pattern, and to produce a logarithmic pulse pattern generator which is not limited in number of log bases to which patterns can be generated.

Another object of the present invention is to provide a logarithmic pulse pattern generator which reduces truncating errors without a delay in producing the pattern.

SUMMARY OF THE INVENTION

The above and other objects of the present invention are obtained through the use of apparatus for converting a first pulse pattern into any one of a plurality of second pulse patterns, including means for generating one of the second pulse patterns in response to the pulses of the first pulse pattern, and adjustable means of controlling the generating means to generate any desired one of the second pulse patterns.

With the present invention, a first pulse pattern, such as a linear pulse pattern, can be converted into a second pulse pattern, such as a nonlinear pulse pattern. By use of the adjustable means of the invention, a plurality of second pulse patterns can be produced from the first pulse pattern. This has the advantage of providing flexibility so that the same apparatus can be adjusted and then used to measure a variety of events having different ranges of interest.

The above and other objects of the present invention are also obtained through the use of apparatus for converting a first pulse pattern into a second pulse pattern, including means for generating first digital signals representing a logarithmic pattern to a predetermined base, means for counting the pulses of the first pattern and generating second digital signals representing a count, and means for comparing the first digital signals and the second digital signals and for producing the second pulse pattern in response to the second digital signals equaling the first digital signals. In one embodiment, the means for generating the first digital signals includes a shift register and in another embodiment, this generating means includes a memory.

In the logarithmic pulse pattern generator of the present invention, truncating errors can be reduced without delay in the production of the pattern. Either the shift register or the memory immediately produces signals representing the logarithmic pattern to a predetermined base, which signals are compared to a count of the pulses of the first or linear pulse pattern so that the output logarithmic pattern can be generated. Also, the shift register and the memory are capable of providing signals that represent any log base so that logarithmic patterns to any base can be produced.

BRIEF DESCRIPTION OF THE DRAWINGS

FIG. 4 is yet another timing diagram for the circuit of FIG. 1 for generating yet another nonlinear pulse pattern.

FIG. 5 is a graph illustrating a family of nonlinear pulse patterns that can be produced with the circuit of FIG. 1.

FIG. 6 is a schematic illustration of one embodiment of a logarithmic pulse pattern generator of the present invention.

FIG. 7 is a timing diagram of the circuit of FIG. 6.

FIG. 8 shows, schematically, another embodiment of a logarithmic pulse pattern generator of the present invention.

FIG. 9 illustrates, schematically, yet another embodiment of a logarithmic pulse pattern generator of the present invention.

DESCRIPTION OF THE PREFERRED EMBODIMENTS

Figure 1:
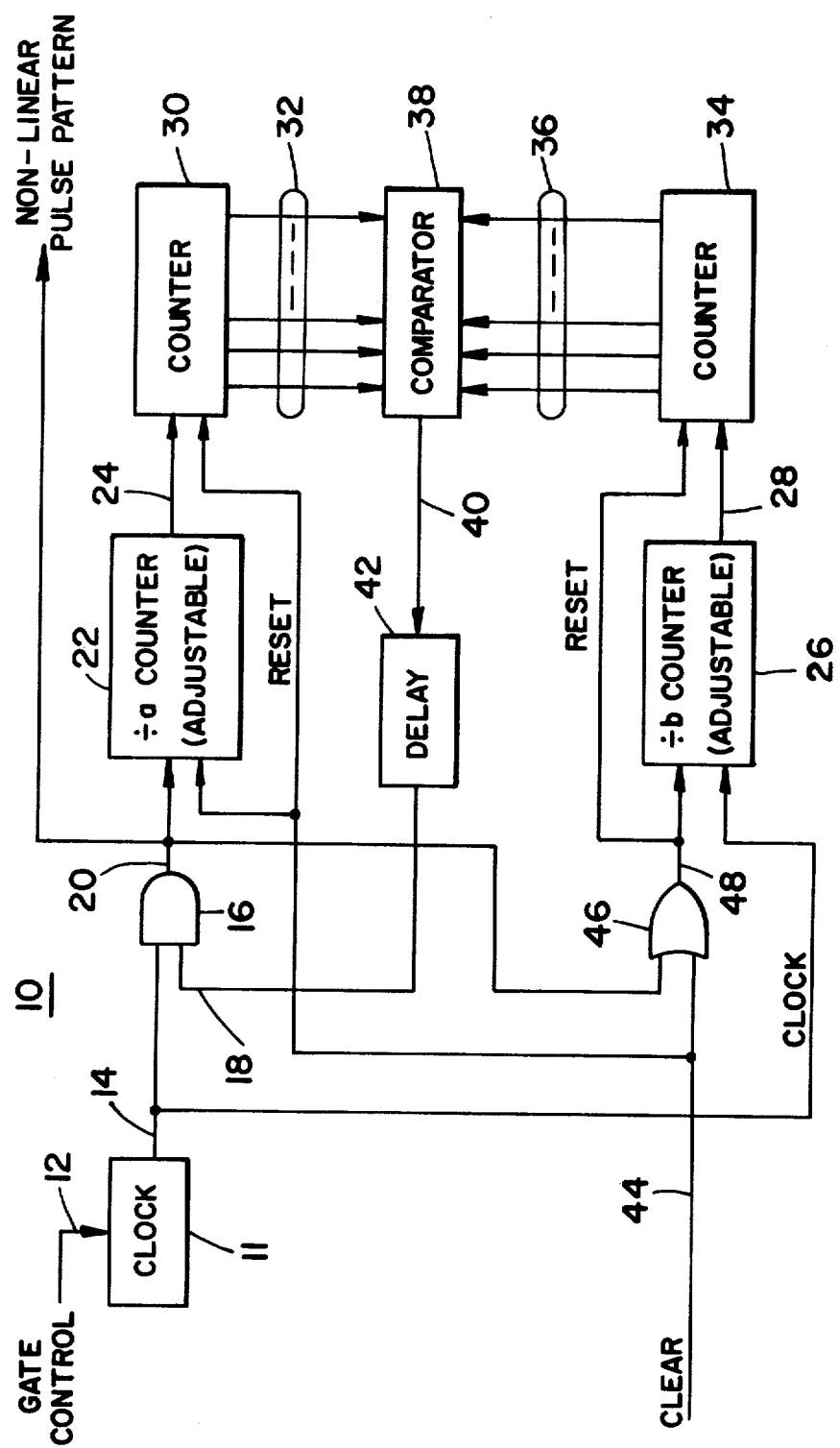
FIG. 1 is a schematic illustration of a nonlinear pulse pattern generator of the present invention.
Figure 2:
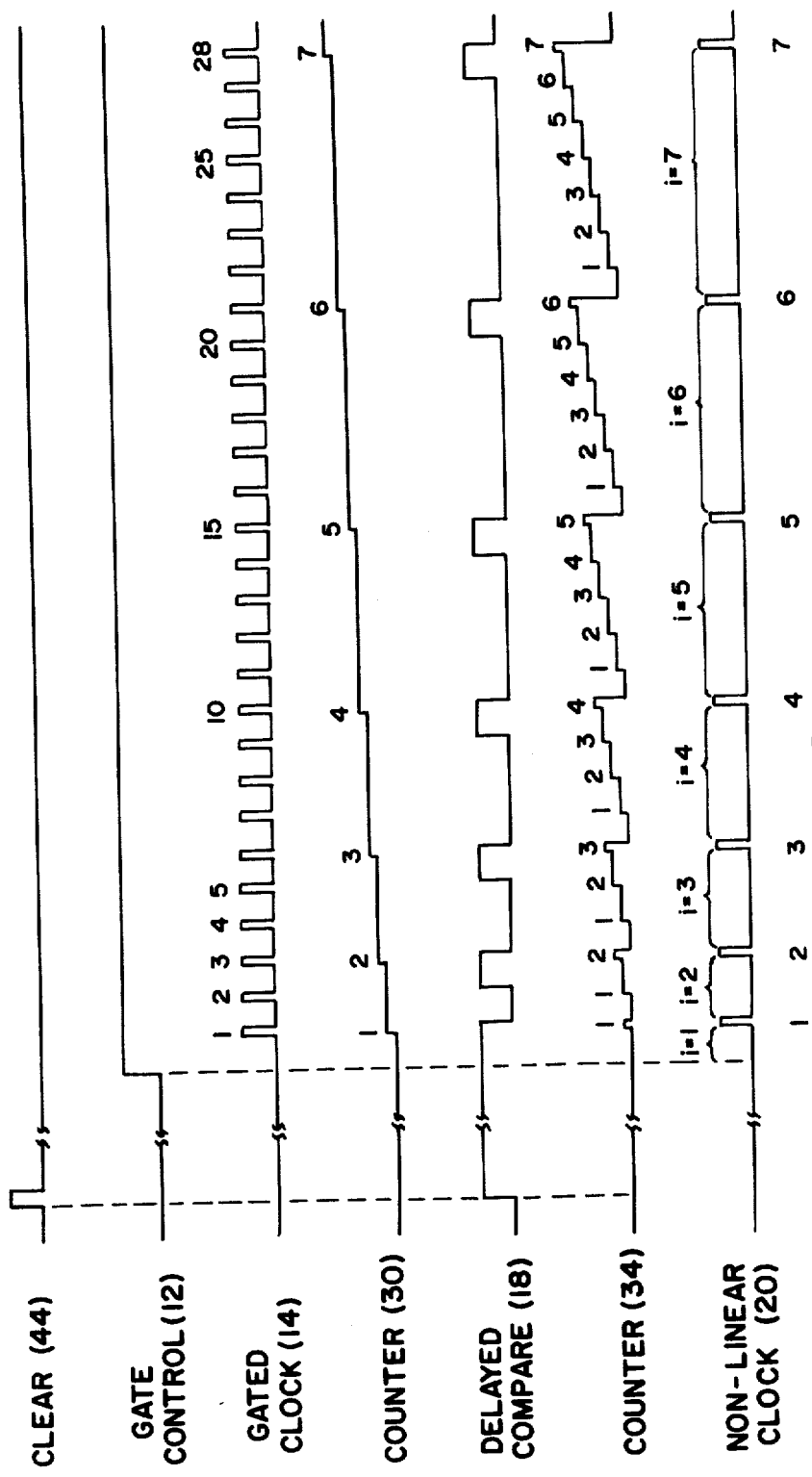
FIG. 2 is a timing diagram for the circuit of FIG. 1 for generating one nonlinear pulse pattern.

With reference to FIG. 1, a circuit 10 of the invention includes a clock pulse generator 11 which can be energized by a gate control signal on a line 12 to produce a linear pattern of clock pulses on a line 14. An And gate 16 has one input coupled to the line 14 and another input coupled to a line 18. Pulses on line 18 enable the gate 16 to produce gated clock pulses on a line 20 which, as indicated in FIG. 2, are the pulses of a nonlinear pulse pattern produced from the linear pulse pattern on line 14.

An adjustable counter 22, constituting a presettable divider, receives the pulses on line 20 and provides output pulses on a line 24. Counter 22 performs a divide by "a" function and is adjustable to set that value "a". The counter 22 can be, for example, switch controlled or adjusted by a switch (not shown) to set the value "a".

An adjustable counter 26, constituting a presettable divider, receives the pulses of the linear pulse pattern on line 14 and provides output pulses on a line 28. Counter 26 performs a divide by "b" function and can be, for example, switch controlled or adjusted by a switch (not shown) to set the value "b".

A counter 30 counts the pulses on line 24 and provides a digital signal of the count in counter 30 over a line shown generally at 32. A counter 34 counts the pulses on line 28 and provides a digital signal representing the count in counter 34 over a line shown generally at 36. A comparator 38 compares the counts in counter 30 and counter 34 and provides output comparison pulses on a line 40 when these counts are equal. A delay 42 delays the pulses on line 40 to provide delayed pulses on line 18 which enable the gate 16. This delay ensures proper operation of circuit 10 by enabling the circuit components to settle and eliminates race problems due to propagation delays.

A clear pulse is provided on a line 44 to reset the counter 22 and the counter 30. An OR gate 46 gates the clear pulse on line 44 to a line 48 to reset the counter 26 and the counter 34. The gate 46 also is enabled by the pulses on line 20 to reset the counter 26 and the counter 34.

FIG. 2 shows a timing diagram for the circuit of FIG. 1, in which counter 22 and counter 26 are preset to divide by a particular number. Specifically, counter 22 is preset to divide by one, i.e., a=1 and counter 26 is preset to divide by one, i.e., b=1. The reference numerals in parentheses in FIG. 2 show the pulses on the corresponding lines or the count in the counters 30 and 34. FIG. 2 shows pulses 1-28 of the linear pulse pattern on line 14 and pulses 1-7 of the nonlinear pulse pattern on line 20.

In operation, a clear pulse on line 44 first clears the counter 22, the counter 30, the counter 26 and the counter 34. As a result, counter 30 equals counter 34 so that comparator 38 is asserted and an output pulse is provided on line 40. Delay 42 delays this output pulse to provide the delayed compare pulse on line 18.

Next, a gate control pulse is generated on line 12 to activate clock 11. This produces pulse 1 of the linear pulse pattern on line 14 and pulse 1 of the nonlinear pulse pattern on line 20 since gate 16 is enabled at this time. Simultaneously, the pulse 1 on line 14 immediately increments counter 34 by one since counter 26 has been set to divide by one. The pulse 1 on line 20 also immediately increments counter 30 by one since counter 22 has been set to divide by one and resets counter 26 and counter 34. Therefore, after pulse 1 on line 20 is generated, counter 30 has a count of one and counter 34 has a count of zero so that these two counters are unequal and the delayed output on line 18 is low.

As will now be shown, because counter 30 has a count of one it requires two clock pulses on line 14 to be generated before pulse 2 of the nonlinear pulse pattern on line 20 is generated. At the time pulse 2 on line 14 is produced, gate 16 is disabled but counter 34 is incremented by one to a count of one. At this time, therefore, counter 30 equals counter 34 so that comparator 38 provides a pulse on line 40. As indicated in FIG. 2, this pulse is sufficiently delayed so that the delayed pulse on line 18 enables gate 16 after the pulse 2 on line 14 is generated, whereby pulse 2 on line 20 is not yet generated.

Then when pulse 3 on line 14 is generated, gate 16, which is now enabled by the delayed pulse on line 18, provides pulse 2 of the nonlinear pattern on line 20. This pulse 2 on line 20 increments counter 30 through counter 22 to a count of two and resets counter 26 and counter 34 to zero. Consequently, counter 30 does not equal counter 34 and the pulse on line 18 goes low to disable gate 16.

With counter 30 at a count of two, it now takes three pulses on line 14 before pulse 3 of the pattern on line 20 is generated. This process continues, as can be seen in FIG. 2, in which counter 30 is incremented by one with each pulse on line 20 and counter 34 reset by the pulse on line 20. Thus, when counter 30 is at a count of three, it takes four pulses on line 14 to generate pulse 4 on line 20, etc.

The mathematical expression for the nonlinear pulse pattern generated by the circuit of FIG. 1 with counter 22 set to divide by one and counter 26 set to divide by one is:

$$\sum_{i=1}^{n} i = \frac{n(n+1)}{2} \quad (1)$$

where $i = 1, 2, 3 \ldots n$ and $n(n+1)/2$ is the number of pulses on line 14 required to produce n pulses on line 20. Thus, a range compression ratio of $(n+1)/2$ is obtained for the nonlinear pattern on line 20 over the linear pattern on line 14.

Figure 3:
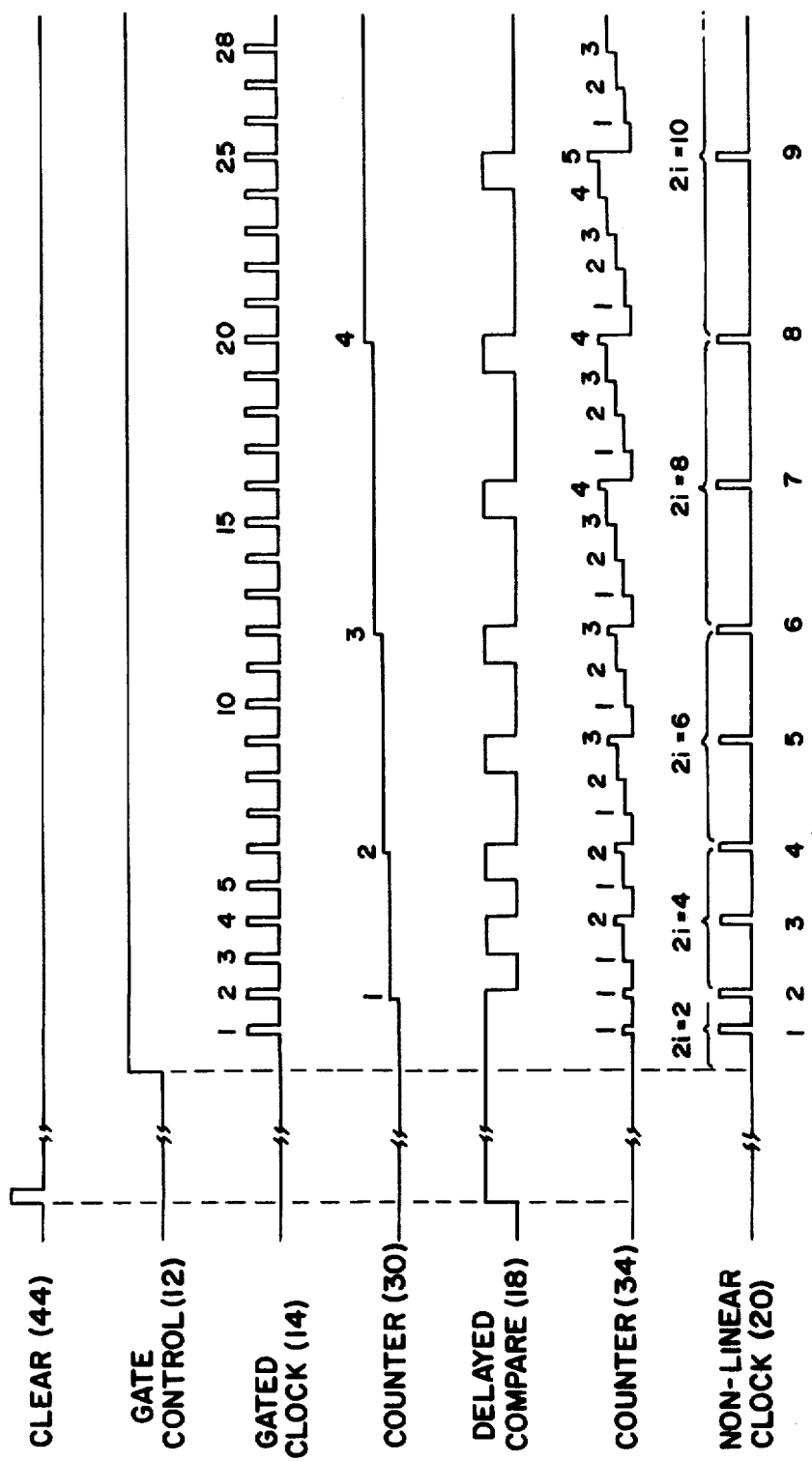
FIG. 3 is a timing diagram for the circuit of FIG. 1 for generating another nonlinear pulse pattern.

FIG. 3 shows another timing diagram for the circuit of FIG. 1 where counter 22 is preset to divide by two, i.e., $a=2$ and counter 26 is preset to divide by one, i.e., $b=1$. A clear pulse is generated on line 44 to reset the counter 22, the counter 30, the counter 26 and the counter 34. Therefore, at this time, counter 30 is equal to counter 34 and a delayed pulse is provided on line 18 by comparator 38 and delay 42 to enable gate 16. Then, a gate control pulse on line 12 is generated to energize clock 11 which then produces pulse 1 of the linear pattern on line 14. When such a pulse on line 14 is generated, pulse 1 of the nonlinear pattern on line 20 is generated since gate 16 is enabled. This pulse 1 on line 20 is counted by counter 22 and increments counter 34 by one since counter 26 is set to divide by one. However, pulse 1 on line 20 also resets counter 34 so that counter 30 and 34 remain equal and the enabling pulse on line 18 continues to be produced. Counter 30 is not yet incremented because of the divide by two function of counter 22.

Next, pulse 2 on line 14 is generated which results in the generation of pulse 2 on line 20 since gate 16 is enabled. This pulse 2 on line 20 increments counter 22 to a count of two, whereby a pulse is provided on line 24 to increment counter 30 to a count of one. Counter 34 is reset by the pulse 2 on line 20 to a count of zero. As can be seen from FIG. 3, two pulses on line 14 are then generated to produce pulse 3 on line 20 and thereafter two pulses on line 14 are generated to produce pulse 4 on line 20. Thereafter, two sets of three pulses on line 14 are required to produce pulse 5 and pulse 6, respectively, on line 20, followed by two sets of four pulses on line 14 to produce pulse 7 and pulse 8 on line 20, etc.

The mathematical expression for the nonlinear pattern generated by the circuit of FIG. 1 with counter 22 preset to divide by 2 and counter 26 preset to divide by one is:

$$\sum_{i=1}^{n} 2i = n(n+1) \quad (2)$$

where $2i = 2, 4, 6 \ldots 2n$ and $n(n+1)$ is the number of pulses on line 14 required to produce 2n nonlinear pulses on line 20. The compression ratio is $(n+1)/2$ for 2n nonlinear pulses.

FIG. 4 shows a timing diagram for the circuit for FIG. 1 in which counter 22 is preset to divide by one, i.e., $a=1$, and counter 26 is preset to divide by two, i.e., $b=2$. From this timing diagram it can be seen that it requires one pulse on line 14 to generate pulse 1 on line 20, followed by three pulses on line 14 to produce pulse 2 on line 20, followed by five pulses on line 14 to produce pulse 3 on line 20, etc. The mathematical expression for the nonlinear pattern on line 20 that is produced with counter 22 preset to divide by one and counter 26 preset to divide by two is:

$$\sum_{i=1}^{n} (2i - 1) = n^2 \quad (3)$$

where $(2i-1) = 1, 3, 5, 7 \ldots (2n-1)$, and $n^2$ is the number of clock pulses on line 14 required to produce n nonlinear pulses on line 20. The compression ratio here is n. This nonlinear pattern is the same as that produced by the generator of the U.S. Pat. No. 3,566,095, as shown in FIG. 3 of this patent.

FIGS. 2-4 indicate that a plurality of nonlinear pulse patterns on line 20 can be generated from a single linear pulse pattern on line 14 by presetting counters 22 and 25 to divide by "a" and "b," respectively, and by arranging the circuit 10 of FIG. 1 as shown. Equations 1-3 have been given to describe mathematically, a particular embodiment of circuit 10.

A general equation for circuit 10 is:

$$\sum_{i=1}^{n} a[b(i - 1) + 1] = an[\frac{b}{2}(n - 1) + 1] \quad (4)$$

wherein a=division number for counter 22 and b=division number for counter 26. The expression $[b(i-1)+1]$ obtains the spacing between the pulses of the nonlinear pattern on line 20 for any given value of i for the range $i=1, 2, 3, \ldots n$, and a is the number of times the pulse spacing is repeated for value i. For example, with reference to FIG. 3, with $i=3$, the pulse spacing is 3 and this is repeated twice $(a=2)$ as can be seen from pulses 4-6 on line 20. The expression $an[(b/2)(n-1)+1]$ derives the number of gated linear clock pulses on line 14 required to produce a $\times$n nonlinear clock pulses on line 20. The compression ratio is $[(b/2)(n-1)+1]$ for a$\times$n nonlinear pulses.

From the general equation (4), a number of pulse patterns can be tailored to meet measurement range and resolution requirements for, for example, a limited size of count capacity and memory. FIG. 5 plots the number of linear clock pulses required for a$\times$n nonlinear clock pulses for other values of a and b. This plot shows how the shapes of the curves can be manipulated by the appropriate choice of coefficients a and b. Coefficient b greatly influences the slope of the curves by determining the spacing between pulses while coefficient a dictates the number of times pulses are repeated at a given pulse spacing.

Although the examples of FIGS. 1 through 5 indicate the coefficients a and b being manipulated in a binary (1, 2, 4, 8 . . .) manner, the coefficients a and b can be any integer desired with appropriate circuit modifications.

It is usually convenient to convert the nonlinear clock number (NLC) into its equivalent linear clock number (LC) before analyzing the event being measured.

If the following equation is taken, $$(NLC/a) = n + R,  \quad (5)$$

n and the remainder R can be determined. By examining Equation (4), an expression can be derived for calculating the equivalent linear clock number which is:

$$LC = an[(b/2)(n-1)+1] + aR[bn+1], \quad (6)$$

where $aR[bn+1] = aR[b([n+1]-1)+1]$ is derived from the expression on the left hand side of Equation (4).

As one example, NLC = 500, a = 64 and b = 1. From Equation (5) n and R are determined by $$(NLC/a) = (500/64) = 7.8125, \quad (7)$$

where n = 7 and R = 0.8125, and substituting into Equation (6):

$$LC = 64 \times 7[\tfrac{1}{2}(7-1)+1] + 64 \times 0.8125[1 \times 7 + 1] = 22\text{-}08 \quad (8)$$

As can now be appreciated, circuit 10, excluding counters 22 and 26, can be considered to be a circuit which generates a single nonlinear pulse pattern from a linear pulse pattern. Counters 22 and 26, by presetting a and b, provide for one of many nonlinear patterns generated from a single linear pattern.

FIG. 6 illustrates a circuit 50 for generating a logarithmic pulse pattern from a linear pulse pattern. Circuit 50 includes a clock 52 which is energized by a gate control pulse on a line 54 to produce clock pulses of a linear pattern on a line 56. An And gate 58 has one input coupled to the line 56 and another input coupled to a line 60 which provides an enabling pulse for the gate 58 to produce clock pulses of a logarithmic pulse pattern on an output line 62.

A binary shift register 64 is clocked by the pulses on line 62 and has a shift-in input coupled to a line 66. With each clock pulse on line 62, a logic 1 is shifted in to stages $2^0, 2^1, 2^2, \ldots 2^n$ of register 64. As will be shown, shift register 64 provides digital signals representing a logarithmic pattern over an output shown generally at 68.

A binary counter 70 counts the pulses on line 56 and provides digital signals representing the counts in counter 70 over an output line shown generally at 72. A comparator 74 compares the data in register 64 with the count in counter 70 and provides an output pulse on a line 76 when the data in register 64 equals the count in counter 70. A delay 78 delays the pulse on line 76 to produce a delayed enabling pulse on the line 60 for the same reason as delay 42.

A clear pulse is provided on a line 80 to reset the shift register 64 and to enable an Or gate 82 whose output is provided on a line 84 to reset the counter 70. Gate 82 is also enabled by the pulses of the logarithmic pattern on line 62 to reset the counter 70.

In the operation of circuit 50 of FIG. 6, and in relation to the timing diagram of FIG. 7, a clear pulse on line 80 resets the shift register 64 and the counter 70. Therefore, both the register 64 and the counter 70 have a value of zero so that the delayed output pulse on line 60 is high to enable gate 58. Thereafter, the gate control pulse on line 54 is generated to energize clock 52.

Next, when pulse 1 of the linear clock pattern on line 56 is generated, shift register 64 is clocked to shift in a logic 1 at the $2^0$ stage, whereby a value of 1 is stored. This clock pulse on line 62 also constitutes pulse 1 of the logarithmic pulse pattern. Counter 70 is incremented to a count of one by pulse 1 on line 56 and is immediately reset by the pulse 1 on line 62. Gate 58 thereby becomes disabled due to the pulse on line 60 going low.

Then, with gate 58 being disabled, pulse 2 on line 56 increments counter 70 to count of one which is now equal to the value stored in shift register 64. The delayed compare pulse on line 60 is then generated to enable gate 58. Thereafter, pulse 3 on line 56 is gated by gate 58 to produce pulse 2 of the logarithmic pattern on line 62. This pulse 2 clocks shift register 64 which now stores logic 1's in the $2^0$ and $2^1$ positions corresponding to a value of 3. Counter 70 is reset by this pulse 2 on line 62 so that the delayed compare pulse on line 60 again goes low.

As can now be appreciated, with shift register 64 storing a value of 3, it requires three additional pulses on line 56 of pulse 6 to increment 70 to a count of 3. As a result, a delayed compare pulse on line 60 is generated to enable gate 58. Then, when pulse 7 is provided on line 56, pulse 3 of the logarithmic pulse pattern on line 62 is generated. This pulse 3 also clocks shift register 64 so that the value stored in register 64 is 7.

The above operation continues whereby it can be seen that shift register 64 generates a logarithmic pulse pattern resulting in the generation of a logarithmic pulse pattern on line 62. Since the contents of the shift register 64 progress in a logarithmic manner, the equation for the circuit 50 is:

$$\sum_{i=1}^{n} 2^{(i-1)} = 2^n - 1. \quad (9)$$

Again, in a similar manner as shown in FIG. 1, more flexibility in the circuit 50 of FIG. 6 can be obtained by placing a divider such as counter 22 before the shift register 64. This allows the relationship of the logarithmic pulse pattern versus the linear pulse pattern to be manipulated in a manner similar to that shown in FIG. 5. The equation for this relationship in which the divider is utilized is:

$$\sum_{i=1}^{n} a[2^{(i-1)}] = a[2^n - 1] \quad (10)$$

where a equals the division of the divider placed before the shift register 64. The shape of the curves relating the logarithmic pulse pattern to the linear pulse pattern and the coefficient a can be selected to fit, for example, time or energy range of the event under consideration.

Also, the equivalent linear clock number (LC) can be determined from the logarithmic clock number by first determining n and R from Equations (5). Then, n and R are substituted in the following equation:

$$LC = a[2^n - 1] + aR[2^n].$$

FIG. 6 shows the circuit 50 which can generate a logarithmic pattern to the log base 2. FIG. 8 illustrates an alternative embodiment 85 of circuit 50 of FIG. 6. for generating a logarithmic pulse pattern to the log base 10. The circuit 85 is substantially similar to circuit 50 and like numerals are used to indicate like elements.

In circuit 85, the binary shift register 64 is utilized; however, the output of each stage $2^0$, $2^1$, $2^2$, etc., is coupled to inputs 1 and 8 of comparator 74. Thus, when a logic 1 is shifted into stage $2^0$ of register 64, comparator 74 sees this as a 9, when a 1 is next shifted in so that stages $2^0$ and $2^1$ have 1's, comparator 74 sees the contents of the register 64 as 99, etc. It can thus be appreciated that as a pulse of the logarithmic pattern is generated on line 62, shift register 64 will generate a logarithmic patten which effectively is to the log base 10.

Circuit 85 also includes a decimal counter 70' in place of the binary counter 70 of FIG. 6. Counter 70' counts the pulses of the linear pattern on line 56. Consequently, comparator 74 will provide an output pulse on line 76 as the counter 70' follows a sequence through 9, 99, 999, etc. The operation of circuit 85 is similar to circuit 50.

It can now also be seen that a logarithmic pulse pattern to another base such as the log base 8 can be simply provided. This is accomplished by coupling each stage of the binary shift register 64 to the positions 1, 2 and 4 of the comparator 74 and by using an octal counter ($8^0$, $8^1$, ... $8^n$) in place of the decimal counter 70'.

FIG. 9 shows a circuit 86, which is an alternative embodiment of the circuit 50 or 85, for generating a Napierian or natural logarithmic pulse pattern. For example, the circuit 86 can generate a logarithmic patten to the base e as will now be described. Again, like reference numerals are used in FIG. 9 to show similar elements as used in FIGS. 6 and 8.

Circuit 86 shows a memory 88 which can be, for example, a read-only memory (ROM), a programmable readonly memory (PROM) or a random access memory (RAM). At each location of memory 88 a value is stored that is equal to $e^{(i-1)} - 0.001$, where i equals location 0, 1, 2, 3, etc. of memory 88. An example of these values is given in the listing below:

$$e^{(1-1)} - .001 = e^0 - .001 = 1.000 - .001 = .999$$
$$e^{(2-1)} - .001 = e^1 - .001 = 2.718 - .001 = 2.717$$
$$e^{(3-1)} - .001 = e^2 - .001 = 7.389 - .001 = 7.388$$
$$e^{(4-1)} - .001 = e^3 - .001 = 20.086 - .001 = 20.085$$
$$e^4 - .001 = 54.597$$
$$e^5 - .001 = 148.412$$
$$e^6 - .001 = 403.428$$
$$e^7 - .001 = 1096.632$$

A counter 90 constitutes an address counter for the memory 88. Counter 90 can be the same counter as counter 30 of FIG. 1 but, as just noted, is now being used as an address counter.

In the operation of circuit 86, first a clear pulse on line 80 is generated to reset counter 90 and counter 70. At this time, comparator 74 will be comparing the unequal values 0.999 at location 0 from memory 88 and 0.000 from counter 70 so that gate 58 is disabled. In this example where the accuracy of the circuit 86 is to the third decimal place, the ratio of the frequency of the Naperian or natural logarithmic clock on line 62 to the frequency of clock 52 is $$(1/1000) = 0.001$$

Thereafter, when clock 52 is energized by the gate control pulse on line 54, pulse 999 of the linear pulse pattern on line 56 causes a count in counter 70 to equal the value from memory 88 (i.e., 999 divided by 1000 equals 0.999). Comparator 74 then goes high so that gate 58 becomes enabled. Pulse 1000 of the linear pulse pattern on line 56 is gated by gate 58 to produce pulse 1 of the logarithmic pattern on line 62 and to clock counter 90. As a result, location 1 of memory 88 is addressed to output the second value shown in the above listing which is 2.717. Counter 70 is reset by this pulse 1 on line 62. Thereafter, comparator 74 goes low until counter 70 counts pulses on line 56 equal to the value from memory 88 (i.e., 2717 divided by 1000 equals 2.717).

Comparator 74 then goes high so that gate 58 is enabled. When the next following pulse on line 56 is generated, this is gated by gate 58 to produce pulse 2 on line 62 of the logarithmic pulse pattern and to increment counter 90. Therefore, memory 88 is addressed at location 2 to produce the next value of the above listing. Again, counter 70 will be reset, whereby comparator 74 will go low and not go high again until counter 70 counts pulses corresponding to this new value.

It can now be seen that this operation of circuit 86 will continue with memory 88 generating a logarithmic pattern to the log base e. As a result, the pattern on line 62 will be to the log base e.

Thus, the logarithmic pulse generators of the present invention have the advantage of generating a pattern to any log base, depending, for example on the set-up of the shift register of FIGS. 6 and 8 and the data stored in memory 88. Also, truncating errors can be minimized by the size of memory 88 chosen for the number of decimal places desired. Log patterns are generated immediately upon receiving the next pulse after which counter 70 counts pulses on line 56 equal to the value from memory 88 in FIG. 9 and immediately on receiving the first pulse of the linear pulse pattern of FIGS. 6 and 8.

What is claimed is:

1. Apparatus for converting a first pulse pattern into any one of a plurality of second pulse patterns, comprising:
   (a) means for generating one of the second pulse patterns in response to pulses of the first pulse pattern;
   said generating means including,
   first counter means for counting pulses of the desired one of the second pulse patterns,
   second counter means for counting pulses of the first pulse pattern, and
   means for comparing the count of said first counter means and said second counter means to provide the desired one of the second pulse patterns; and
   (b) adjustable means for controlling said generating means to generate any desired one of the second pulse patterns.

2. Apparatus according to claim 1 wherein said adjustable means comprises:
   (a) first means for dividing the pulses of the desired one of the second pulse patterns by a predetermined number to provide first output pulses, said first counter means counting the first output pulses; and
   (b) second means for dividing the pulses of the first pulse pattern by a predetermined number to provide second output pulses, said second counter means counting the second output pulses.

3. Apparatus according to claim 2 wherein said first and second counter means said comparing means, and said first and second dividing means are arranged to provide any one of the second pulse patterns in accordance with the equation:

$$\sum_{i=1}^{n} a[b(i-1)+1] = an[\frac{b}{2}(n-1)+1]$$

where a is the division number of said first dividing means, b is the division number of said second dividing means, [b(i−1)+1] is the spacing between pulses of the desired one of the second pulse patterns for any given value i where i=1, 2, 3, . . . n, and a is the number of times the pulse spacing is repeated for value i.

4. Apparatus according to claim 2 wherein said first means for dividing and said second means for dividing each comprises a presettable counter.

5. Apparatus according to claim 1 wherein said second counter means comprises:
   (a) a counter; and
   (b) means for resetting said counter in response to the pulses of the desired one of the second pulse patterns.

6. Apparatus for generating a plurality of nonlinear pulse patterns from a linear pulse pattern, comprising:
   (a) means for generating first pulses of the linear pulse pattern;
   (b) means for gating the first pulses to produce secnd pulses of one of the nonlinear pulse patterns;
   (c) first adjustable means for dividing the second pulses by a predetermined number a to produce third pulses;
   (d) first counter means for counting the third pulses;
   (e) second adjustable means for dividing the first pulses of the linear pulse pattern by a predetermined number b to produce fourth pulses;
   (f) second counter means for counting the fourth pulses and being reset by the second pulses; and
   (g) means for comparing the count of said first counter means and said second counter means and for enabling said gating means in response to equal counts.

7. Apparatus according to claim 6 wherein said first adjustable means and said second adjustable means each comprises a presettable counter.

8. Apparatus according to claim 6 wherein said means for comparing and enabling comprises:
   (a) a comparator having inputs coupled to said first counter means and said second counter means, respectively, and providing output pulses in response to the equal counts; and
   (b) delay means for delaying the output pulses to enable said gating means to gate a pulse of the linear pulse pattern following a pulse of the linear pulse pattern producing one of the equal counts.

9. Apparatus for converting a first pulse pattern into a second pulse pattern, comprising:
   (a) shift register means for generating first digital signals representing a logarithmic pattern to a predetermined base;
   (b) means for counting the pulses of the first pattern and generating second digital signals representing a count; and
   (c) means for comparing the first digital signals and the second digital signals and for producing the second pulse pattern in response to the second digital signal equaling the first digital signals.

10. Apparatus according to claim 9 wherein said shift register means comprises:
    (a) a shift register; and
    (b) means for clocking said shift register with each pulse of the second pulse pattern.

11. Apparatus according to claim 9 wherein said shift register means comprises a binary shift register.

12. Apparatus according to claim 9 wherein said shift register means comprises:
    (a) a binary shift register; and
    (b) means for connecting said binary shift register to said comparing means to generate a logarithmic pulse pattern to a base other than the log base 2.

13. A logarithmic pulse generating comprising:
    (a) means for generating a linear pulse pattern;
    (b) a shift register for generating first digital signals representing a logarithmic pattern;
    (c) a counter for counting the pulses of the linear pulse pattern and generating second digital signals representing a count;
    (d) a comparator for comparing said second digital signals and said first digital signals and generating a comparison signal;
    (e) means for gating the pulses of said linear pulse pattern in response to the comparison signal to provide an output logarithmic pulse pattern; and
    (f) means for clocking said shift register and resetting said counter with the pulses of said output logarithmic pulse pattern.

14. Apparatus for converting a first pulse pattern into a second logarithmic pulse pattern, comprising:
    (a) memory means for storing and outputting first digital signals representing a logarithmic pattern to a predetermined base;
    (b) means for counting the pulses of the first pattern and generating second digital signals representing a count; and
    (c) means for comparing the first digital signals and the second digital signals and for producing the second logarithmic pulse pattern in response to the second digital signals equaling the first digital signals.

15. Apparatus according to claim 14 wherein said memory means comprises:
    (a) a memory for storing said first digital signals; and
    (b) means for addressing said memory.

16. Apparatus according to claim 15 wherein said means for addressing comprises:
    (a) an address counter; and
    (b) means for clocking said address counter with the pulses of the second logarithmic pulse pattern.

17. Apparatus according to claim 15 wherein said memory is a read-only memory.

18. Apparatus according to claim 17 wherein said read-only memory is programmable.

19. Apparatus according to claim 15 wherein said memory is a random access memory.

* * * * *